US006392467B1

(12) United States Patent
Oowaki et al.

(10) Patent No.: US 6,392,467 B1
(45) Date of Patent: May 21, 2002

(54) SEMICONDUCTOR INTEGRATED CIRCUIT

(75) Inventors: Yukihito Oowaki, Kanagawa-ken; Tsuneaki Fuse, Tokyo, both of (JP)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 09/612,679

(22) Filed: Jul. 10, 2000

Related U.S. Application Data

(63) Continuation of application No. 08/956,956, filed on Oct. 23, 1997, now Pat. No. 6,087,893.

(30) Foreign Application Priority Data

Oct. 24, 1996 (JP) .......................................... PO-282508

(51) Int. Cl.[7] .......................................... H03K 17/687

(52) U.S. Cl. .......................................... 327/427; 326/113

(58) Field of Search .......................... 323/281; 326/112, 326/113; 327/77, 89, 530, 534, 535, 537, 427

(56) References Cited

U.S. PATENT DOCUMENTS 4,140,930 A * 2/1979 Tanaka ........................ 307/362
4,309,627 A * 1/1982 Tabata ........................ 307/362
4,559,488 A * 12/1985 Minakuchi .................. 323/281
4,716,307 A * 12/1987 Aoyama ..................... 307/297
5,404,053 A * 4/1995 Poma et al. ................ 327/108
5,570,004 A * 10/1996 Shibata ....................... 323/303
5,721,485 A * 2/1998 Hsu et al. .................... 323/901
5,729,172 A * 3/1998 Tsukada ...................... 327/536
5,821,769 A * 10/1998 Douseki ....................... 326/34
5,844,404 A * 12/1998 Caser et al. ................ 323/314
5,892,267 A * 4/1999 Takada ........................ 327/536
6,175,264 B1 * 1/2001 Jimbo ......................... 327/536

OTHER PUBLICATIONS

1994 IEEE "A Dynamic Treshold Voltage MOSFET (DTMOS) for Ultra–Low Voltage Operation", pp. 94–909–94–912, Fariborz Assaderaghi, Dennis Sinitsky, Stephen Parke, Jeffrey Bokor, Ping K. Ko and Chenning Hu, Department of Electrical Engineering and Computer, University of California at Berkeley, Berkeley, CA.

1996 IEEE International Solid–State Circuits Conference, ISSCC96/Session 5/Technology Directions: High–Speed, Low–Power/Paper TP 5.6, pp. 88–89.

* cited by examiner

*Primary Examiner*—Jeffrey Zweizig
(74) *Attorney, Agent, or Firm*—Anderson Kill & Olick; Eugene Lieberstein; Michael N. Meller

(57) ABSTRACT

A stable high-speed integrated circuit driven by a wide range of low voltages and consuming low power. A MOSFET is used wherein signals are applied to its gate and body for forming a circuit block which comprises a transistor network and at least one buffer circuit. Each buffer circuit has at least two configurations. A plurality of circuit blocks are formed on the same IC chip. Any of the configurations of the buffer circuit may be selected according to the magnitude of the capacitance of the load driven by the circuit block.

10 Claims, 18 Drawing Sheets

FIG. 7

| PASS TRANSISTOR TYPE | BUFFER-TYPE | PMAS LATCHING RELAY, YES ? | FAN-OUT FO=1 | FAN-OUT FO=3 |
|---|---|---|---|---|
| NMOS ONLY | TYPE 1 | YES | 720 PS | 1130 PS |
| | | NO | 690 PS | 1280 PS |
| | TYPE 2 | YES | 710 PS | 1400 PS |
| | | NO | 830 PS | — |
| MNOS PARALLEL | TYPE 1 | NO | 850 PS | — |
| | TYPE 2 | NO | 830 PS | — |

THE DELAY PER STEP IN A FULL ADDER

FULL DEPLETION

PARTIAL DEPLETION

SEMICONDUCTOR INTEGRATED CIRCUIT

This application is a continuation of U.S. application Ser. No. 08/956,956 filed Oct. 23, 1997 now U.S. Pat. No. 6,087,893.

The present invention relates to a semiconductor integrated circuit (IC). More particularly, the present invention relates to a semiconductor IC using MOSFETs in which signals are applied to the gate and body of the MOSFETs.

BACKGROUND OF THE INVENTION

In recent years, the operating speed of a large-scale integrated circuit (LSI) has increased significantly. An LSI which operates at 500 MHZ or faster has also been disclosed. The faster the LSI operates, the larger the power consumption because the loading and parasitic capacitances are charged/dissipated at a high frequency. To resolve this problem, ways to decrease the operating voltage and power consumption while maintaining the high-speed operation capability have been studied.

Recently, a silicon-on-insulator (SOI) device technique, in which a device is fabricated on a silicon layer on an insulator layer has been proposed for the low-voltage operation of a circuit. Much effort has been made to reduce the operating voltage below 0.5V using SOI devices. SOI CMOS with gate-body connection (DTMOS) and body bias controlled SOI pass-gate logic (BCSOI) pass-gate) take advantage of individually SOI device activated area and reduce threshold voltage by controlling each device body bias. Hence, they have a higher speed than circuits based on fixed low threshold voltage. Due to draw-body junction leakage, previous attempts suffer from leakage current at supply voltage higher than 0.8V.

FIG. 15(*a*) shows an SOI-MOSFET in which a thin silicon layer is fabricated on a silicon dioxide layer and a MOSFET device is formed thereon. In this Figure, 1 denotes an isolation layer, 2 denotes a thin silicon layer, 3 denotes a gate-insulation layer, 4 denotes a gate electrode, 5 denotes a source-drain diffusion layer, and 6 denotes a device isolation insulator layer with which bodies 2*a* and 2*b* are isolated for each of the transistors.

FIGS. 15(*b*) and 15(*c*) show the SOI-MOSFET in the ON or active mode. FIG. 15(*b*) shows the fully depleted mode in which no neutral region exists in the body. FIG. 15(*c*) shows the partially depleted mode in which a neutral region exists in the body.

In the SOI-MOSFET in FIG. 15(*a*), the thin silicon layer 2 is isolated by means of the insulation layer 6. This provides, for a given MOSFET, two independent bodies 2*a*, 2*b* (each of which acts like a MOSFET on a bulk substrate of conventional technology). It is possible to take advantage of this and connect a gate and body in each of the MOSFETs. In nMOSFETs, a CMOS gate (e.g., inverter) dynamic-threshold voltage MOSFET called DTMOS, for example, is proposed. In the DTMOS in the ON or active mode, the threshold voltage is low because the body voltage is the source voltage. In the OFF or sleep mode, the body voltage is OV which is suited to high-speed operation at a low voltage. [See F. Assaderaghi, 1994, "A Dynamic Threshold Voltage MOSFET (DTMOS) for Ultra-Low Voltage Operation," *IEDM Tech Dig.*, pp. 809–812].

Also, a SIMOX-MTCMOS technique (SIMOX is one of the methods of manufacturing SOI substrates) is proposed (Douseki et al., *ISSCC* 96 *Tech Dig.*, pp. 84–85). The SIMOX-MTCMOS is configured as follows:

a main circuit is constructed with an SOI-CMOS gate with a low threshold value. The leakage current is limited during the sleep mode by serially connecting a transistor with a high threshold value, which is turned off during the sleep mode, to the main circuit.

However, the following problems remain even when utilizing these techniques. In the former (DTMOS) technique, a signal potential is applied directly to the body. Therefore, if the signal potential, which is the source voltage, is higher (0.8V in a general condition) than the pn junction potential (potential difference between Fermi potential in the p-region and Fermi potential in the n-region), the point between the body (e.g., the p-type in an nMOS) and source (e.g., the n-type in an nMOS) is biased forwardly. This generates leakage current, thus impeding normal operation. FIG. 16(*a*) shows the equivalent circuit with the gate-body connection; FIG. 16(*b*) shows the leakage profile.

On the other hand, in the latter (SIMOX-MTCMOS) technique, as shown in FIG. 17, the leakage current is decreased during the sleep mode. However, because there is no means for controlling the leakage current during the active mode, the lower limit of the threshold voltage (Vt) of the main circuit remains unfavorably high. When the threshold value, which is derived from the lower limit of the leakage current during the active mode for the device shown in FIG. 18, is 0.15V, the threshold value in the former DTMOS technique is 0.15V during the sleep mode. The threshold value is −0.05V during the active mode. In the latter (SIMOX-MTCMOS) technique, the threshold value 0.15V is basically the same during the sleep and active modes. For this reason, the device made with the latter technique operates slower than those made with the former technique using a higher minimum operating voltage.

In addition, both the former and latter techniques use a so-called CMOS logic circuit such as an inverter, NAND logic, etc., as a semiconductor IC which comprises:

a pMOS loading circuit connected to the source power, and an nMOS driving circuit connected to a ground potential.

For this reason, both techniques have not optimized speed, power consumption, and device size.

As described, even if an SOI-MOSFET is used, it is difficult for a semiconductor IC of conventional technology to operate at a high-speed with a wide range of low voltages to consume low power.

For further attempts to solve these problems, reference is made to "Tsuneaki Fuse, Yukihito Oowaki et al, ISSCC96 Tech. Dig. pp. 88–89".

SUMMARY OF THE INVENTION

It is accordingly an object of the present invention to overcome the above-noted problems of prior-art solutions.

The apparatus incorporating the principles of the present invention solves the above problems using an SOI-MOSFET and provides high-speed semiconductor ICs which operate at a high-speed with a wide range of low voltages and consume low power.

In a preferred embodiment of the present invention, a semiconductor integrated circuit is provided having a MOSFET wherein input signals are applied to its gate and body for forming a circuit block for driving a load having a capacitance and which includes:

a transistor network and at least one buffer circuit having at least two configurations wherein a plurality of circuit blocks are formed on the same IC chip, and any of the configurations of the buffer circuit may be selected according to the magnitude of the capacitance of the load driven by the circuit block.

In a further preferred embodiment of the present invention, (1) a MOSFET is formed on a thin silicon layer formed on an insulation layer (SOI), and (2) the buffer circuit comprises:

a first buffer circuit of the CMOS inverter type using a MOSFET in which the gate and body are connected; and a second buffer circuit of the pMOS feedback type in which a pMOSFET and an nMOSFET are serially connected;

the gate-body of the nMOSFET and the body of the pMOSFET are connected to the network output. The gate of the pMOSFET is connected to a complementary output wherein, when the loading capacitance is at least a predetermined value, the first buffer circuit is selected, and when the loading capacitance is smaller than the predetermined value, the second buffer circuit is selected.

In another preferred embodiment of the present invention, the buffer circuit comprises a first buffer circuit of the CMOS inverter type using a MOSFET in which the gate and body are connected, and a second buffer circuit with a pMOS flip-flop latching relay circuit formed at the CMOS inverter type input portion of the buffer circuit using a MOSFET in which a gate and a body are connected, wherein when the loading capacitance is at least a predetermined value, the first buffer circuit is selected, and when the loading capacitance is smaller than the predetermined value, the second buffer circuit is selected.

In still another embodiment of the present invention, the semiconductor IC comprises:

a main circuit which is the pass transistor network constructed with a MOSFET in which signals are applied to its gate and body;

a monitor means inserted between a source power terminal and a grounding terminal for monitoring the source power voltage;

a control means serially connected to the main circuit between the power source terminal and the grounding terminal for comparing the monitored voltage from the monitor means with a reference voltage for controlling the voltage applied to the main circuit.

In yet another embodiment of the present invention, the semiconductor IC comprises:

a main circuit which is the pass-gate transistor network using a MOSFET in which signals are applied to its gate and body;

a booster circuit in which source power voltage to be applied to the main circuit is boosted; and an application means by which the output voltage of the booster circuit is applied only to a circuit which operates at a high voltage.

In accordance with the principles of the present invention, the threshold value of a MOSFET which is part of a circuit block is controlled by connecting its gate and body. This provides the capability to operate at low voltages with low power consumption. In addition, the type of buffer circuit can be selected based on the magnitude of the capacitance of the load driven by the circuit block. This allows constructing circuit blocks with optimized buffer circuits, providing high-speed circuits which operate at low voltages with low power consumption.

The speed (propagation delay) and power consumption is dependent on the loading capacitance in a buffer circuit of a transistor network. Different types of buffer circuits can drive larger or smaller load capacitances at various speeds. For this reason, the apparatus incorporating the principles of the present invention selects the best buffer circuit type based on the loading capacitance. This provides the capability to select the best buffer circuit all the time. This also provides the capability for the circuit to operate at a high speed at a low voltage with low power consumption.

Also according to the principles of the present invention, the voltage applied to the main circuit can be controlled by means of the monitor means and control means. In addition, in the main circuit which is suited to low voltage driving, the source-body junction is biased forwardly. This prevents an unfavorable increase in leakage current and the like in advance.

Moreover in a preferred embodiment of the present invention, even if the source power potential is decreased according to the main circuit suited for low driving voltage, the voltage needed for the circuit which is driven at a high voltage can be applied, thus increasing the reliability of the circuit.

The voltage applied to the main circuit can be limited by means of the monitor circuit and differential operational amplifier circuit. In addition, in the main circuit which is suited to low driving voltage, the source-body junction is biased forwardly, thus preventing an unfavorable increase in leakage current and the like. Further, even if the source power potential is decreased according to the main circuit suited for low voltage driving, the voltage needed for the differential operational amplifier circuit which is driven at a high voltage can be applied, thus increasing the reliability of the circuit.

BRIEF DESCRIPTION OF THE DRAWINGS

The above and other objects, features, and advantages of the present invention will become more apparent from the following detailed description taken with the accompanying drawings, in which:

FIG. 7 is a table showing propagation delay time per step of a full adder using various examples of the body bias-controlled pass-gate circuits used in Embodiment 1;

DESCRIPTION OF THE PREFERRED EMBODIMENTS

Figure 1:
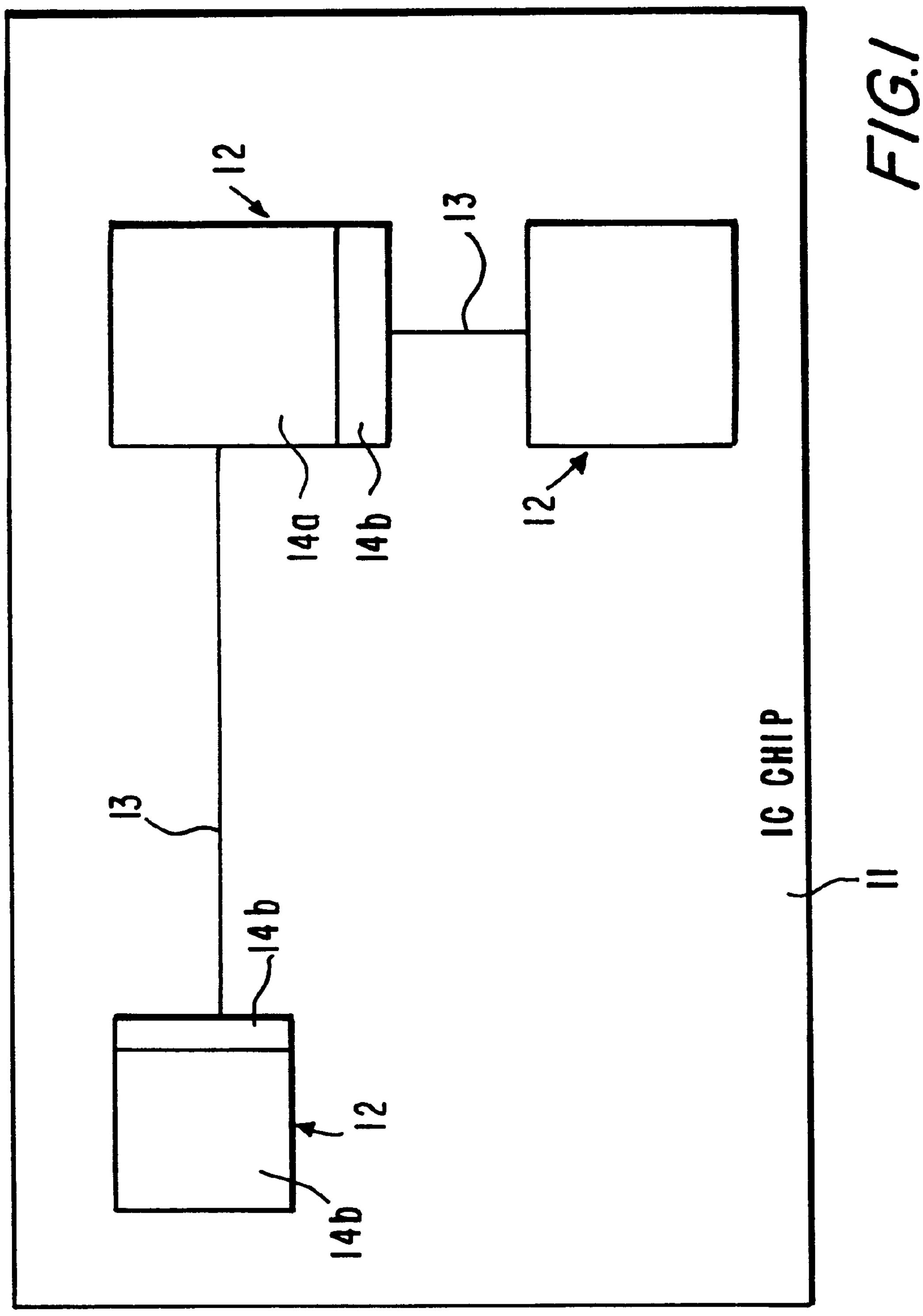
FIG. 1 is a block circuit configuration showing the semiconductor IC of Embodiment 1.

Referring to the drawings, FIG. 1 shows a block circuit configuration of a semiconductor IC of Embodiment 1 of the present invention.

A plurality of circuit blocks 12 are formed on a semiconductor IC 11. The circuit blocks 12 are connected via a global interconnect 13. As will be illustrated, a MOSFET is provided in the circuit block 12 to which signals are applied to both the gate and the body. A plurality of local circuit blocks 14 and pass transistor networks are provided respectively in each of the circuit blocks 12. The local circuit blocks 14 respectively comprise local circuit blocks 14*a* used for a small loading capacitance and local circuit block final step 14*b* used for a large loading capacitance.

Figure 2A:
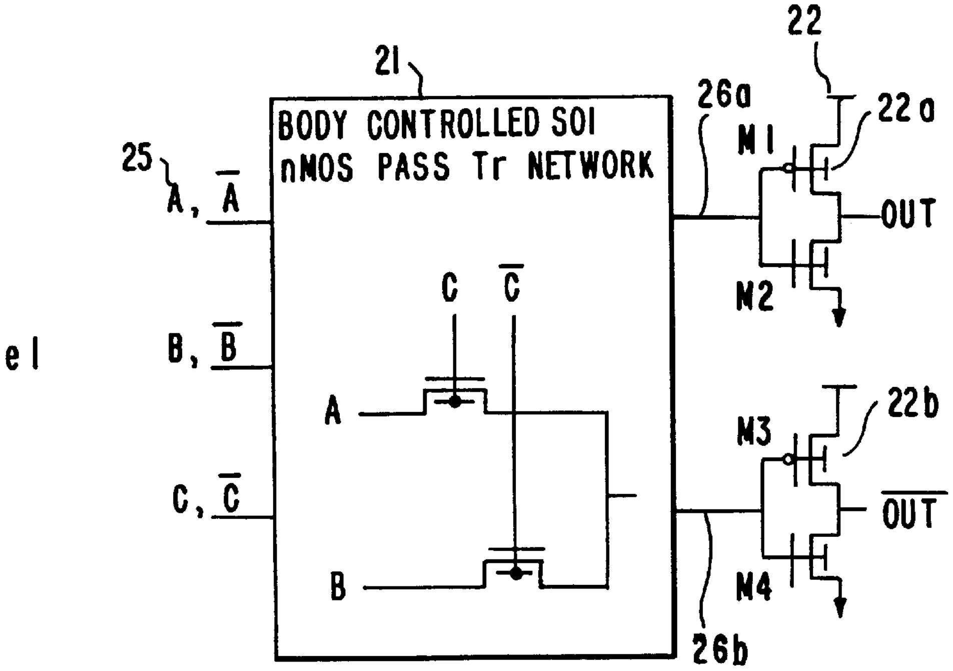
FIG. 2, including FIGS. 2(*a*) and 2(*b*), is a schematic diagram showing a body bias-controlled pass-gate circuit used in Embodiment 1.
Figure 2B:
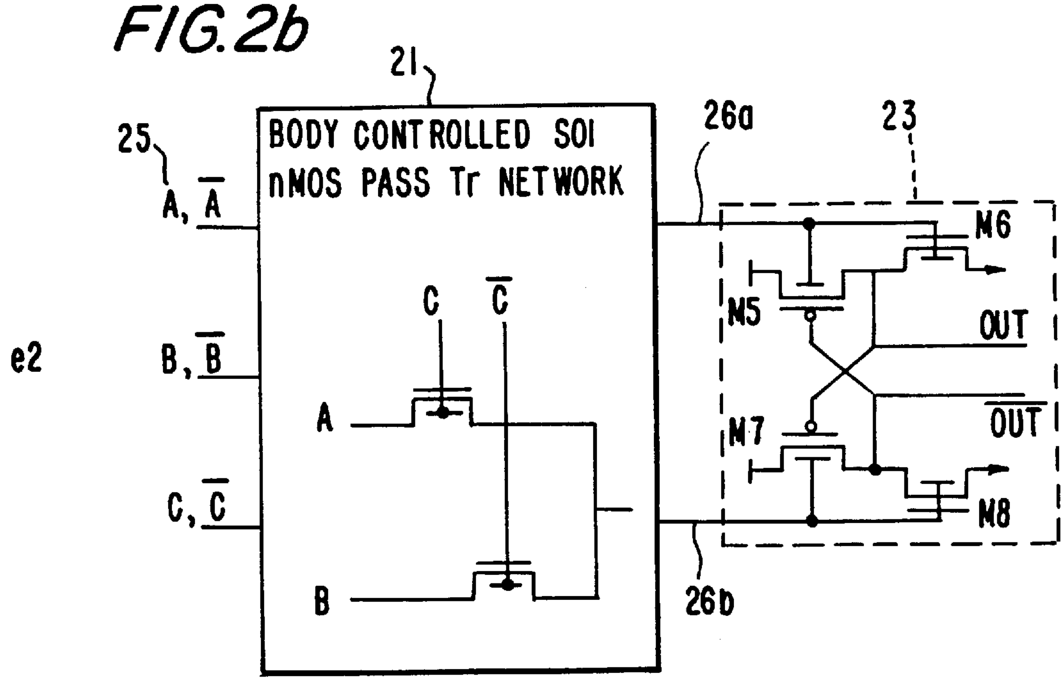

Referring to FIG. 2, a specific configuration of a local circuit block 14 is described. FIG. 2(*a*) and FIG. 2(*b*) each show a body bias-controlled SOI pass-gate logic circuit. These are each configured with an SOI-nMOS pass-gate transistor network 21 in which the pass-gate and the body are connected. In FIG. 2(*a*), a BCSOI pass-gate with inverter type buffer circuit 22 with gate-body connection is illustrated. This circuit is suitable for driving large load capacitance. In FIG. 2(*d*), the BCSOI pass-gate with body bias-controlled pMOS feedback buffer is suitable for smaller load capacitance.

The circuit configuration of the pass transistor network 21 shown in both FIGS. 2(*a*) and 2(*b*) has already been proposed by the present inventors. The threshold value is decreased by decreasing the body potential to lower the driving power, thus reducing the power consumption (see Japanese patent application No. H7-231622). However, the method of utilizing buffer circuits, such as circuits 22 or 23, required to promote high speed and low energy consumption is not disclosed in such proposal.

The buffer circuit 22 in FIG. 2(*a*) forms a CMOS inverter (type 1) with the gate-body connection. That is, the circuit 22 comprises:

a first CMOS inverter 22*a* consisting of a pMOSFET (M1) and an nMOSFET (M2), in which the gate and body are connected, which are connected to the network output; and a second CMOS inverter 22*b* consisting of a pMOSFET (M3) and an nMOSFET (M4), in which the gate and body are connected in the same manner, is connected to the complementary output of the network 21.

In the buffer circuit 23 shown in FIG. 2(*b*), the pMOS body (M5) is interconnected with the network output and its gate is interconnected with the complementary network output to form a body bias-controlled pMOS feedback type (type 2) device. In other words, using the serially connected pMOSFET (M5) and nMOSFET(M6) circuits, the gate-body connection of M6 and the body of M5 are connected to the network 21 output. In the same manner, using the serially connected pMOSFET (M7) and nMOSFET (M8) circuits, the gate-body connection of M8 and the body of M7 are connected to the complementary output of the network 21. Each of the gates of the serially connected circuits M5 and M7 is respectively connected to the output of another set of serially connected circuits.

In FIG. 2, 25 denotes a network 21 input terminal, 26*a* denotes a network 21 output terminal, and 26*b* denotes a network 21 complementary output terminal.

Figure 3:
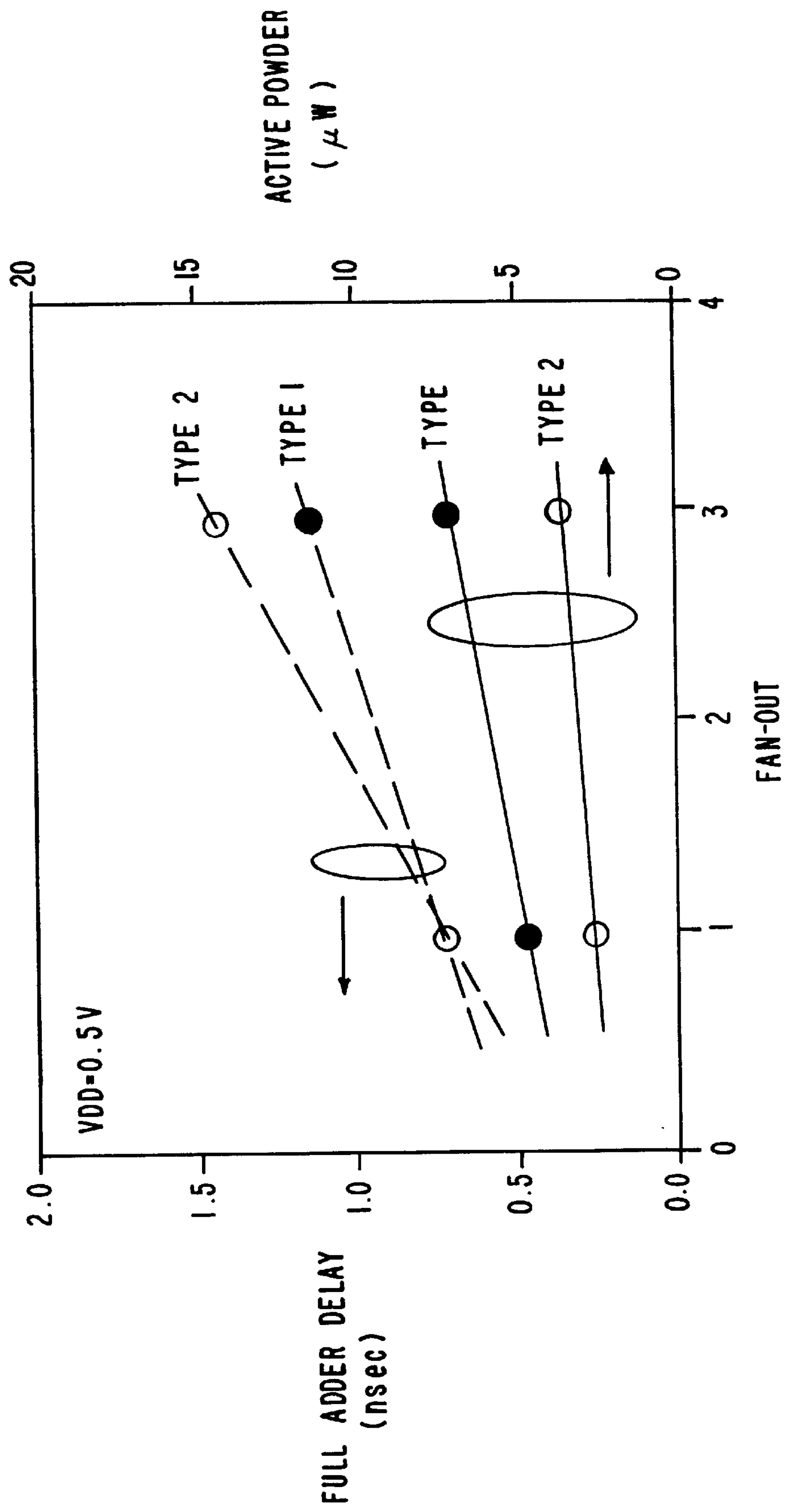
FIG. 3 is a graphical diagram showing the fan-out profile of the body bias-controlled pass-gate circuit of FIG. 2.

FIG. 3 demonstrates the fan-out dependence of these SOI pass-gate circuits for the full adder delay. The BCSOI pass-gate type 1 is faster at heavy loads while the power consumption of the BCSOI pass-gate type 2 is half that of type 1. The speed or driving performance of the type 2 pMOSFET is lower than that of the type 1 because of the propagation delay that occurs when a pMOSFET is turned on. The current drive capability of the pMOS load in the type 2 buffer is smaller than that for type 1 but input capacitance is smaller by cutting-off gate capacitance from the input node. Compared to the type 1, for example, the gate width ratio of a pMOSFET to nMOSFET is normally within the range of 2:1 to 3:1. The MOS gate capacitance which occupies a larger width is isolated from the input capacitance, thus reducing the input capacitance to one-half or less. In this way, the power consumption of the pass network for driving buffers of the type 2 can be reduced by one-half.

As is clear from FIG. 3, the type 1 circuit, which is faster, is suited for driving long-wiring or heavy load; the type 2 circuit, which requires lower power consumption, is suited for driving locally connected circuits.

With this in mind, the type 2 pass-gate transistor network and buffer circuit may be used in a circuit block as shown in FIG. 1, for driving within a local circuit block (local circuit block 14*a*). The type 1 pass-gate network and buffer circuit may be used for driving a global interconnect (local circuit block final step 14*b*) in FIG. 1.

A quantitative analysis is herewith provided for the local and global aspects of interconnects. For an LSI, with a gate length of 0.3 $\mu$m and a metal line width of 0.7 $\mu$m knowing that the layer above the second layer is normally used for the global interconnect, the space between the interconnect and the substrate is typically about 1000 nm to about 2000 nm. Calculating by the parallel-plate approximation technique, its capacitance will be about 24 fF/mm to about 12 fF/mm. If the incoming power lines from side walls and the capacitance required to have other interconnect layers are added, the capacitance may be increased by 50%, reaching about 36 fF/mm to about 18 fF/mm.

On the other hand, if the gate length of the aforementioned pass gate and the gate width is 0.3 $\mu$m and 1.5 $\mu$m respectively, the input capacitance for the network will be about 14 fF/mm. It will be about 7 fF/mm if the size is reduced to one-half In other words, the line length required per fan-out is about 0.5 mm. In this case, the "local" applies to a drive circuit which drives a line shorter than 0.5 mm. The "global" applies to a line equal to or longer than 0.5 mm.

Figure 4A:
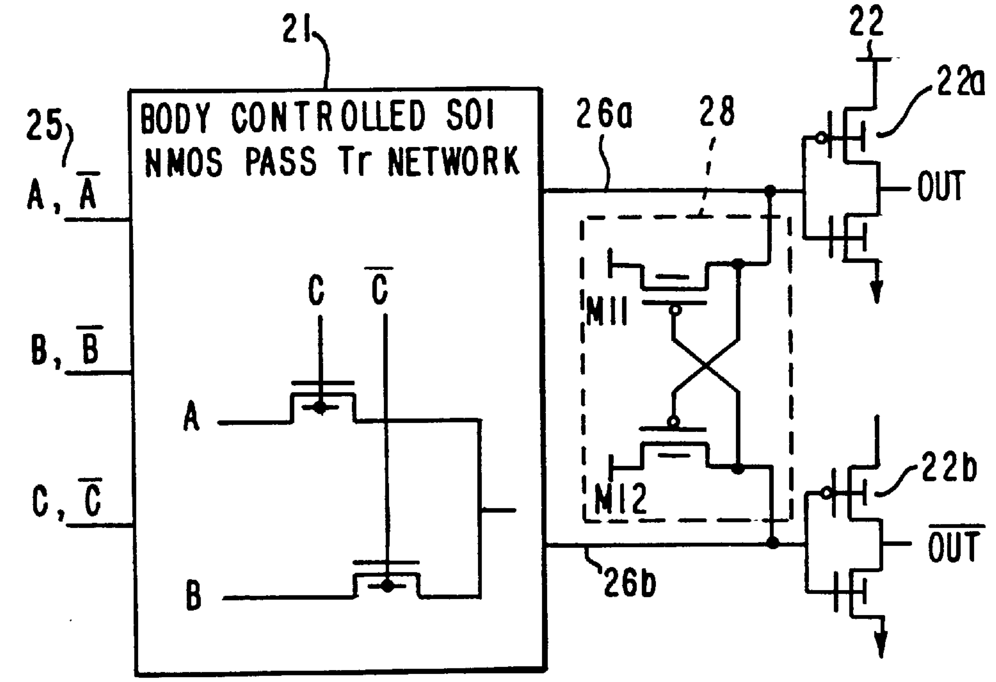
FIG. 4, including FIGS. 4(*a*) and 4(*b*), is a schematic diagram showing another example of a body bias-controlled pass-gate circuit used in Embodiment 1.
Figure 4B:
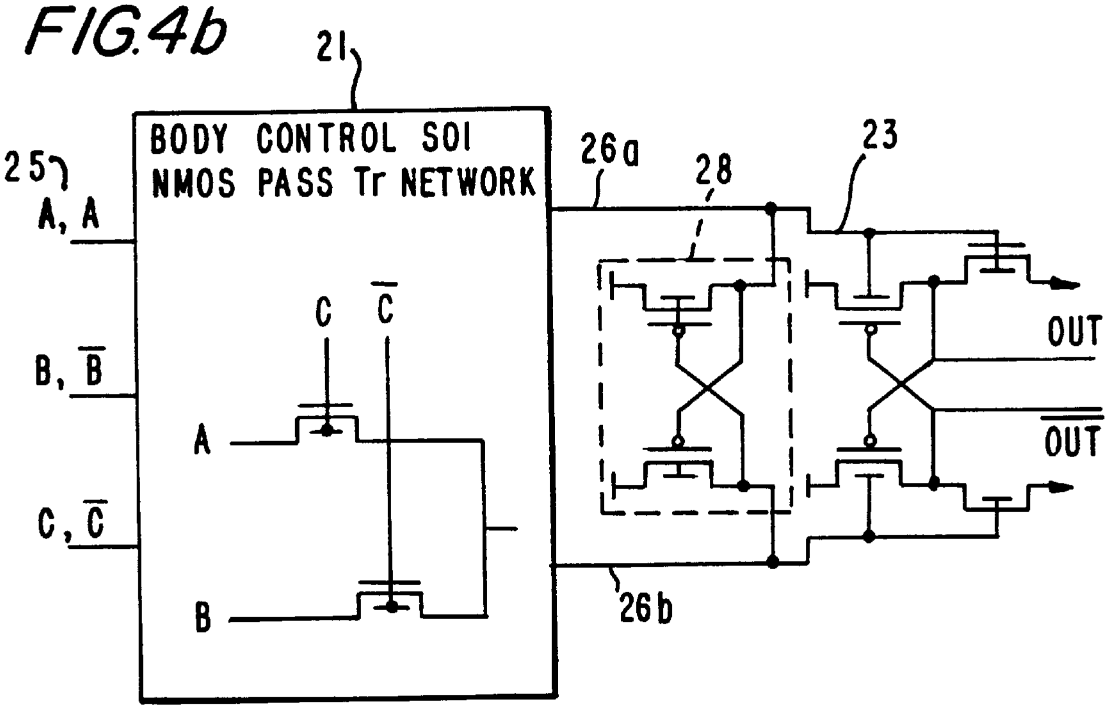

FIGS. 4(*a*) and 4(*b*) are circuit diagrams showing examples in which a pMOS flip-flop latching relay circuit is connected to the output portion of the nMOS pass-gate transistor network 21 with a gate-body connection. In FIG. 4(*a*), a pMOS flip-flop latching relay circuit 28 is connected to the configuration shown in FIG. 2(*a*). In FIG. 4(*b*), a pMOS flip-flop latching relay circuit 28 is connected in the configuration shown in FIG. 2(*b*).

Figure 5:
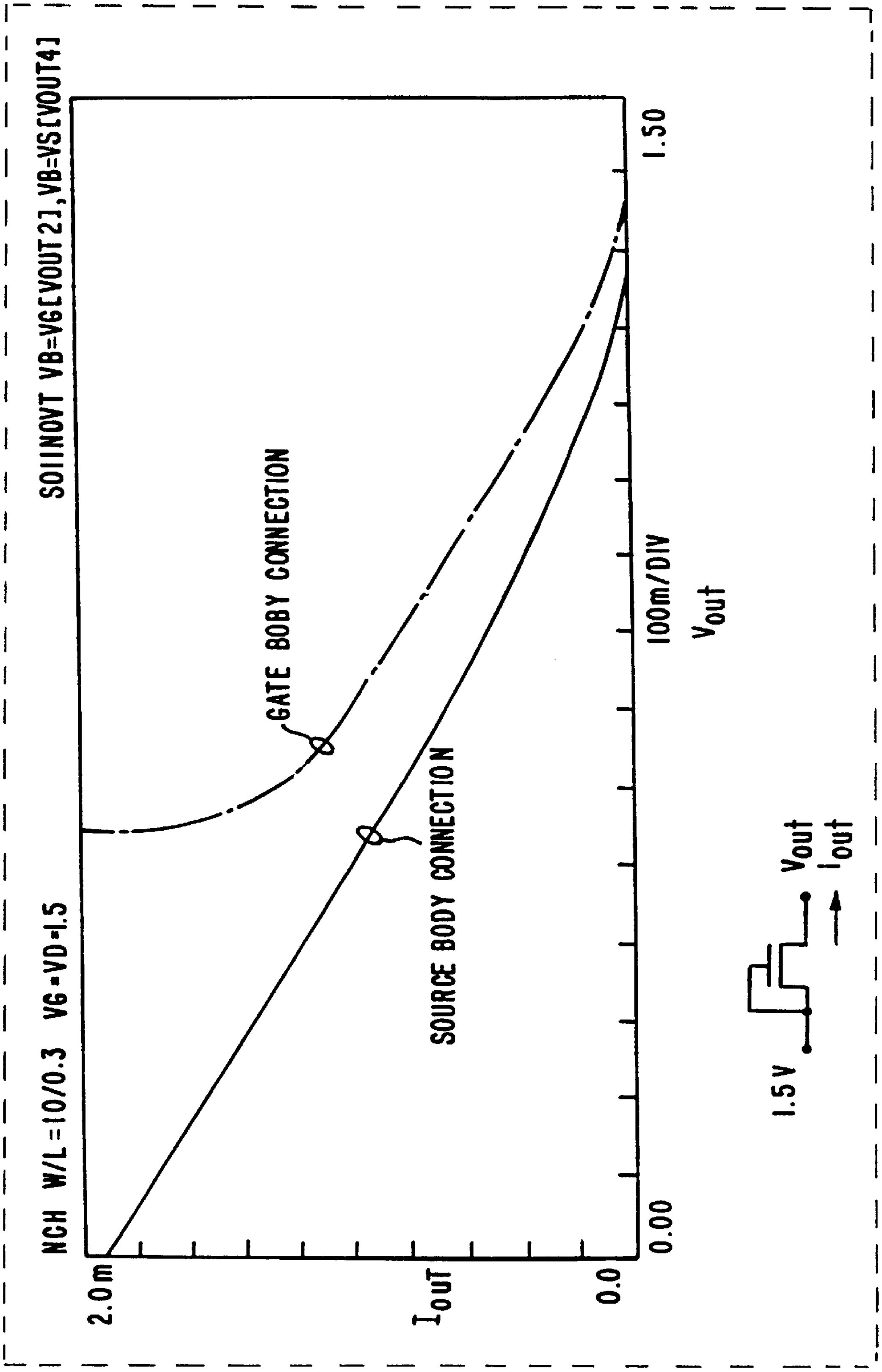
FIG. 5 is a graphical diagram showing the loading capacitance profile of the pass-gate transistor network output.

Referring to FIG. 5, a diagram is provided illustrating the loading capacitance profile of the pass-gate transistor network. As shown in FIG. 5, when a nMOS network in which the gate and body are interconnected, is supplied with a low-source voltage, the body is charged relatively positive and the device demonstrates a high-speed driving performance. However, it reaches the same potential as the device without the gate-body connection. In other words, the output reaches a level below the threshold value.

In FIGS. 4(*a*) and 4(*b*), a pMOS flip-flop latching relay circuit 28 is added to the network to increase the threshold value. Compared to the value obtained from the network without the pMOS flip-flop latching relay circuit 28, the following trade-off may be observed in this configuration:

the gate potential may demonstrate faster driving of the buffer circuit, but the pass transistor network may require a larger loading capacitance.

Figure 6A:
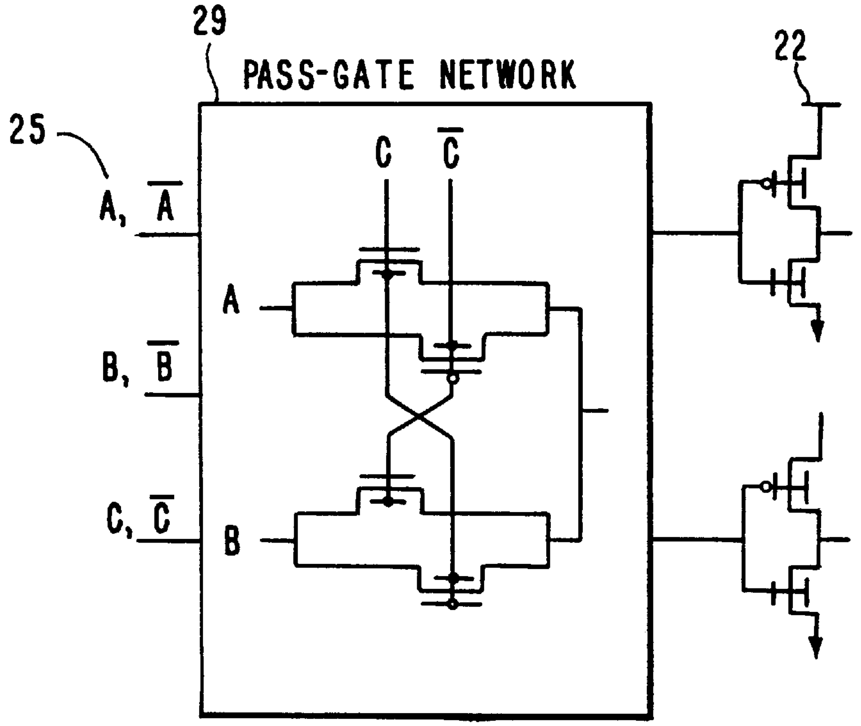
FIG. 6, including FIGS. 6(*a*) and 6(*b*), is a schematic diagram showing another example of a body bias-controlled pass gate circuit used in Embodiment 1.
Figure 6B:
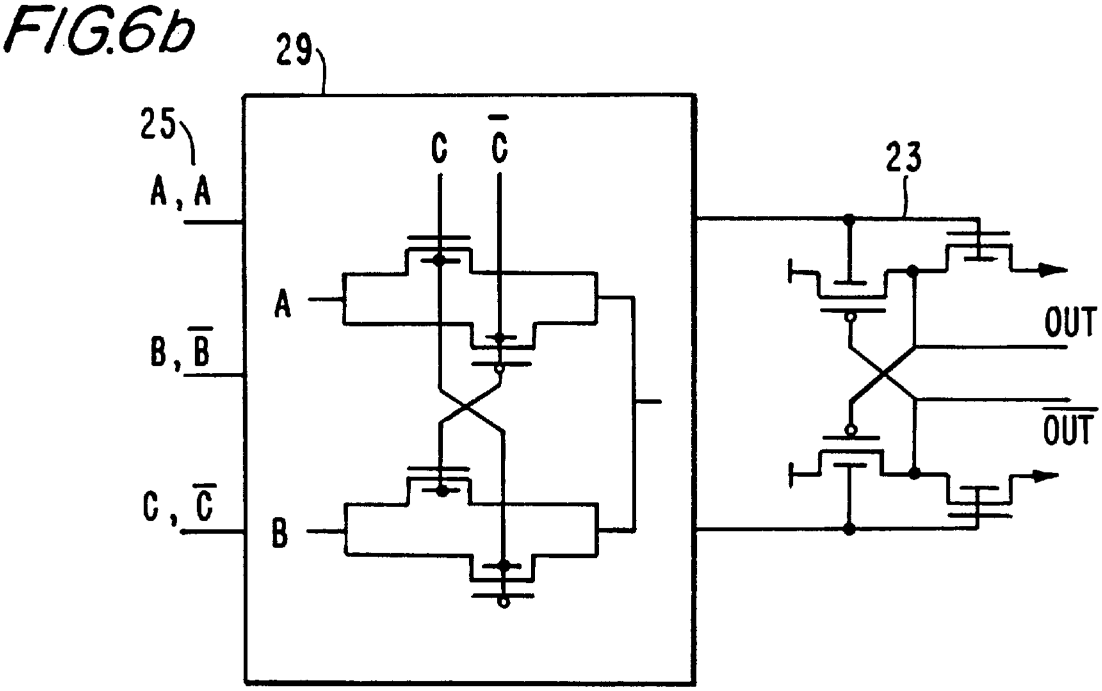

FIGS. 6(*a*) and 6(*b*) show other examples of the local circuit block. In FIG. 6(*a*), the pass-gate transistor network 29 comprises nMOSFETs and pMOSFETs connected in parallel in the type of configuration shown in FIG. 2(*a*). In FIG. 6(*b*), the pass-gate transistor network 29 comprises nMOSFETs and pMOSFETs which are connected in parallel in the type of configuration shown in FIG. 2(*b*). The following trade-off may be observed in this configuration due to the increased number of transistors:

the threshold voltage does not decrease, but the capacitance of the network itself increases.

FIG. 7 is a table showing the results of the propagation delay simulation of these circuits. As is clear from this figure, in terms of speed, the type 1 MOSFET without a pMOS latching relay circuit may be best suited to driving the local circuits. The type 1 MOSFET with a pMOS latching relay circuit may be best suited to driving global interconnects. In terms of low power consumption, the type 2 MOSFET with a pMOS latching relay circuit may be best suited to driving local circuits; the type 1 with a pMOS latching relay circuit may be best suited to driving global interconnects.

As described, this embodiment allows a type 1 or type 2 buffer circuit to be selected based on whether a local circuit block such as an SOI pass gate circuit is driven locally or globally. This embodiment can provide a circuit block having the optimal buffer circuit best suited to its loading capacitance. This makes possible high-speed operation at a low voltage with low power consumption.

In a second embodiment of the present invention, the input step of the buffer circuit is configured as a pass gate circuit. However, it may be configured as a NAND circuit, etc.

Figure 8:
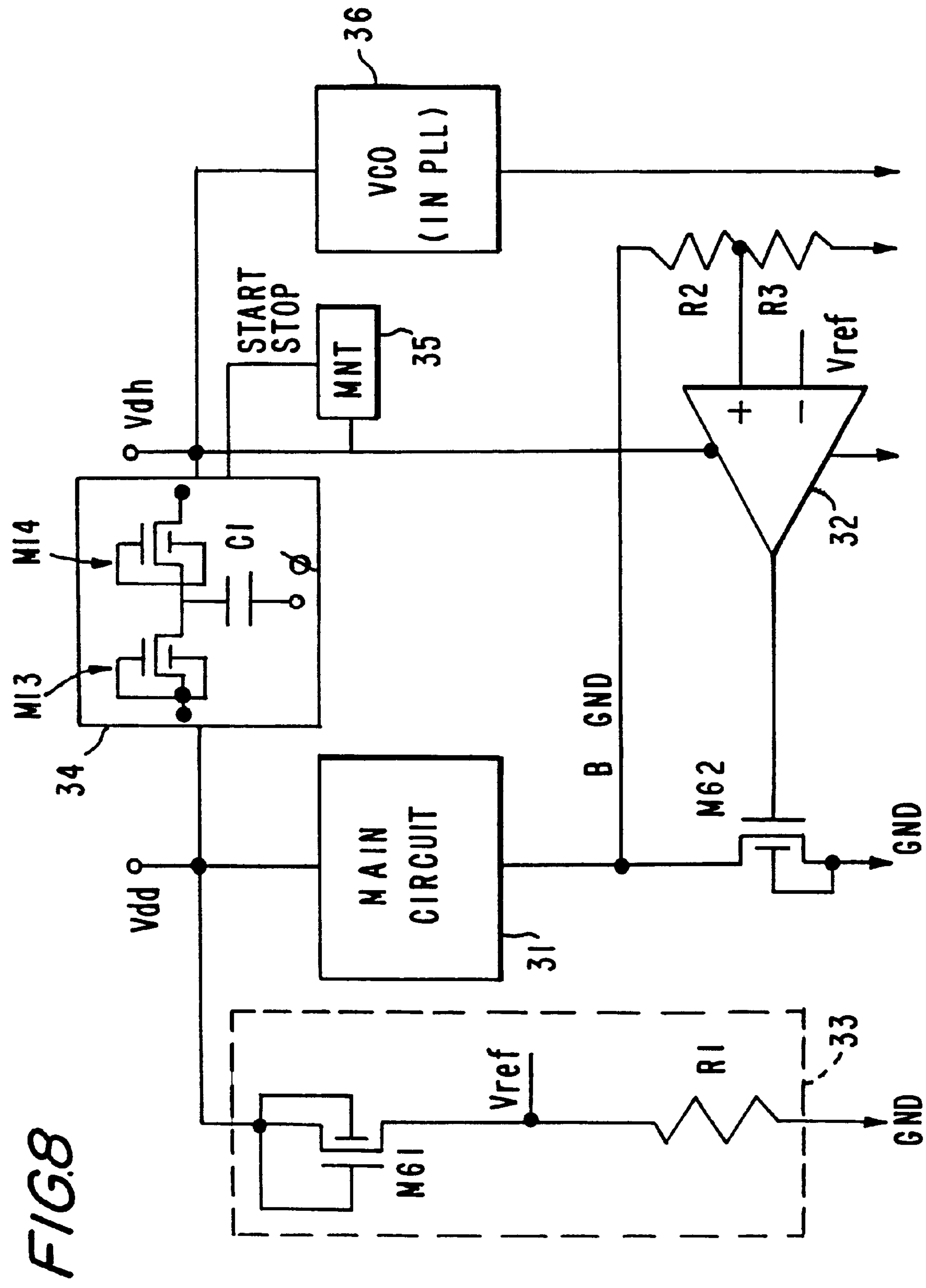
FIG. 8 is a schematic circuit diagram showing the semiconductor IC of Embodiment 2.
Figure 9A:
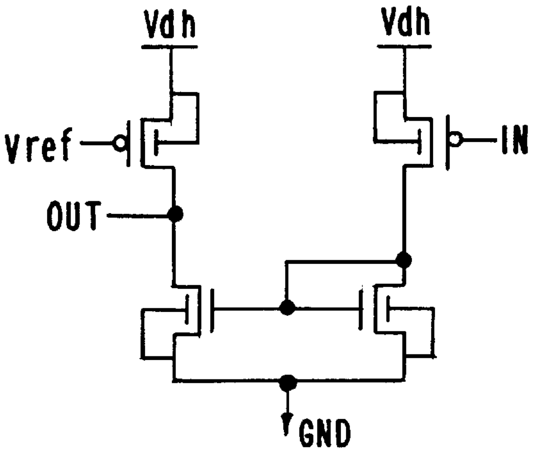
FIG. 9, including FIGS. 9(*a*) through 9(*d*), is a schematic diagram showing an example of the current mirror-type differential operational amplifiers used in Embodiment 2.
Figure 9B:
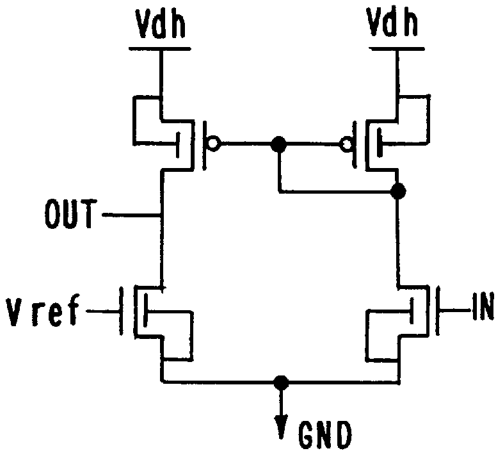
Figure 9C:
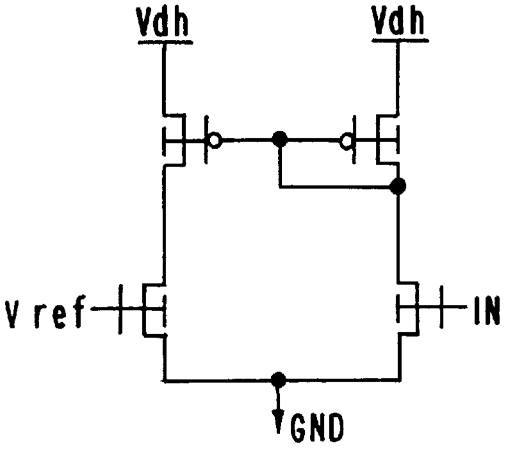
Figure 9D:
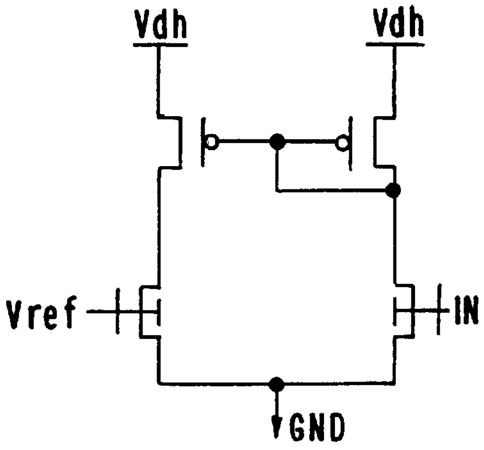

FIG. 8 is a schematic diagram of a semiconductor IC in the second embodiment of the present invention showing the boosted ground concept for BCSOI pass-gate logic.

On the same semiconductor IC chip of FIG. 8, the following four power lines are formed:

power line Vdd;

a booster potential line Vdh;

a grounding line GND; and a boosted ground line BGND which has a higher potential than the grounding line GND.

A main circuit 31 executes all functions of the IC chip. Circuit 31 is connected between the source power line Vdd and the boosted grounding line BGND. The boosted grounding line BGND is applied thereto. The main circuit 31 comprises the SOI-MOSFET pass gate and the like in which signals are applied to the body as shown in the above FIGS. 2, 4, 6, etc.

Figure 15A:
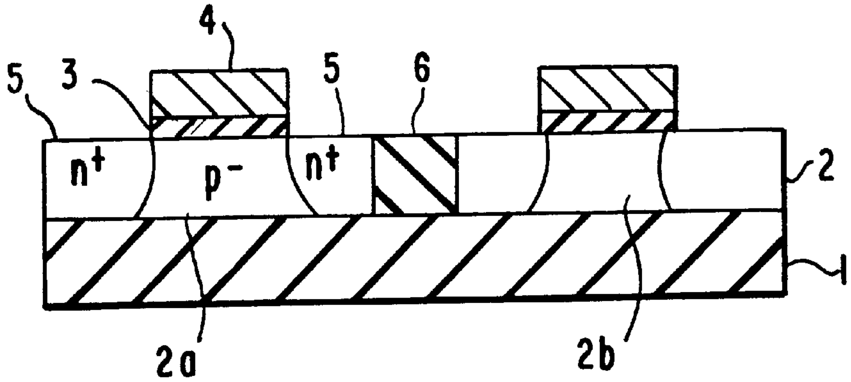
FIG. 15a PRIOR ART
FIG. 15, including FIGS. 15(*a*) through 15(*c*), is a diagram showing the SOI-MOSFET structure and its operation modes.
Figure 15B:
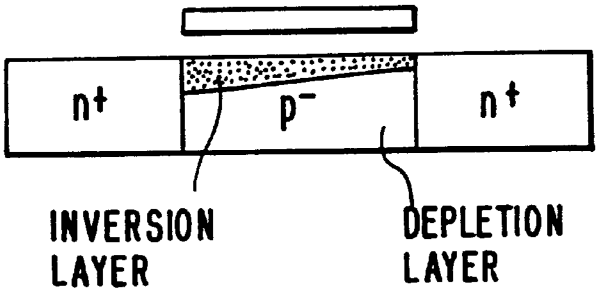
Figure 15C:
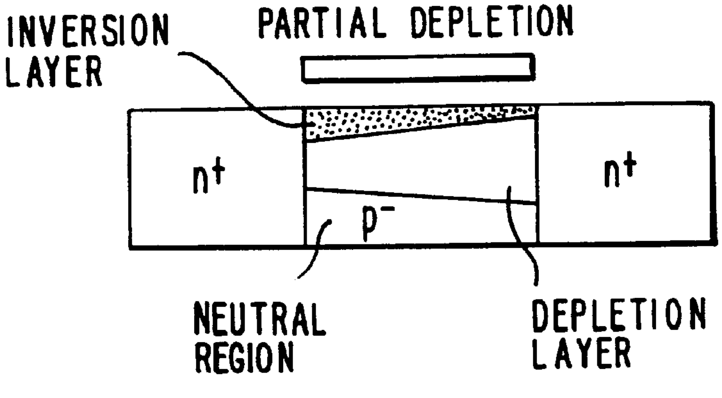

In this second embodiment, any transistor with an electrically isolated body is acceptable. An SOI device as shown in FIG. 15 or any transistor whose wells are isolated with an oxide layer or a dopant region of the reverse conductance type is acceptable. However, to obtain a high-speed device, an SOI device, which has a small parasitic capacitance, better serves the purpose. In a MOSFET, the threshold voltage changes according to the body potential. Therefore, the partially depleted PD type MOSFET, as shown in the aforementioned FIG. 15(*c*), in which a neutral region exists in the body, is preferable. This embodiment is described herein referring to the PD-SOI device for simplicity.

Figure 16A:
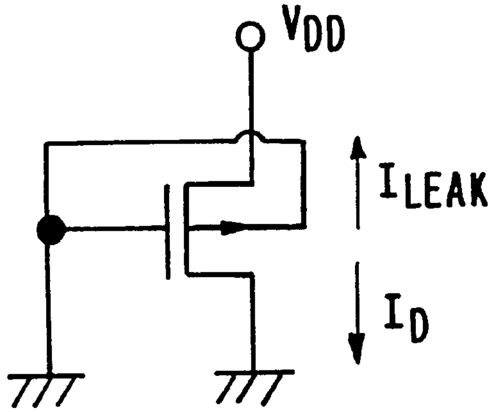
FIG. 16a PRIOR ART
FIG. 16, including FIGS. 16(*a*) and 16(*b*), is a diagram showing the leakage current problem in conventional DTMOS technology.
Figure 16B:
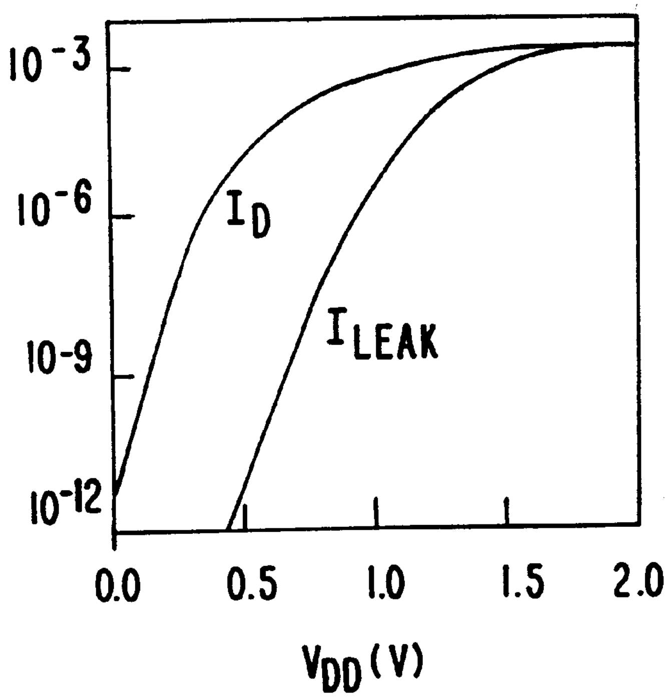
Figure 17:
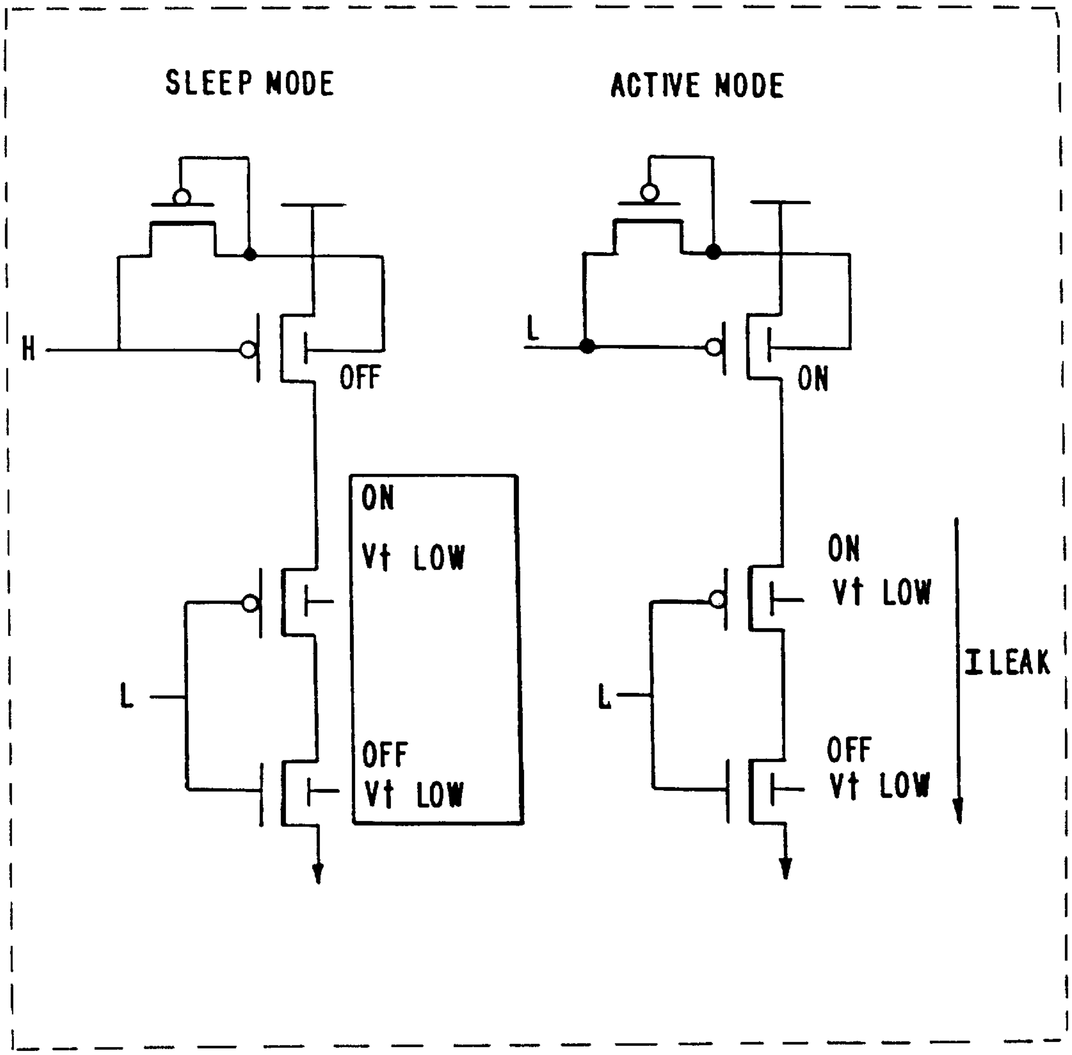
FIG.17 PRIOR ART
FIG. 17 is a diagram showing the problem with conventional MTCMOS technology.
Figure 18:
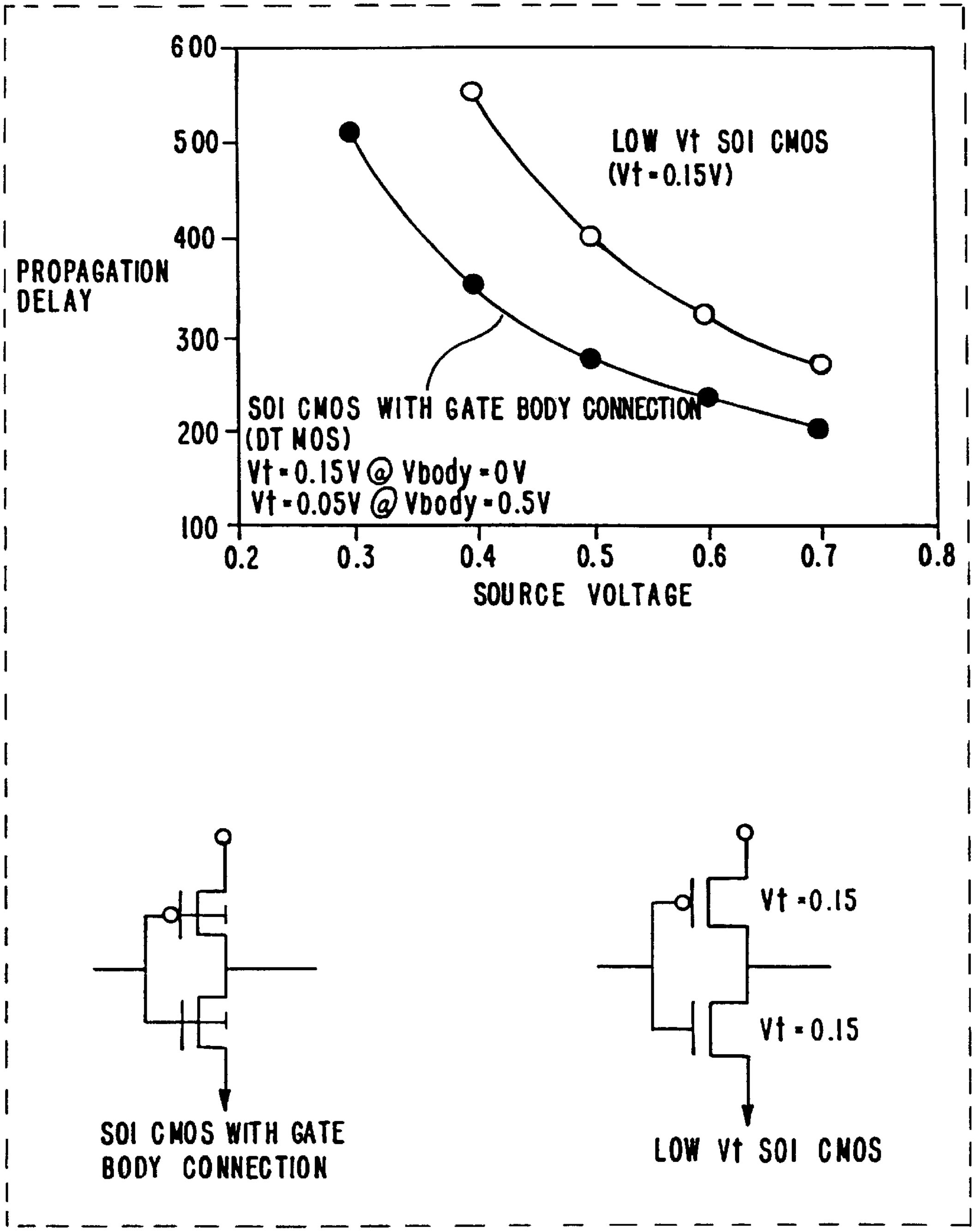
FIG 18 PRIOR ART
FIG. 18 is a diagram comparing the inverter propagation delay times.

The boosted ground (BGND) is driven by the SOI-nMOSFET (M62) in FIG. 8, in which the source and body are connected. This avoids the floating body effect and assures a Vt high enough to suppress stand-by leakage current of the main circuitry. The gate potential of transistor M62 is controlled by a differential operational amplifier 32 to which the BGND potential and the reference potential (Vref) are applied. The BGND potential is divided by resistors R2 and R3 for reasons to be described later. In this arrangement, the connection between the device body (p-type for NMOS) and the source (n-type for nMOS) is not biased. If the connection between the body and the source were biased, a large leakage would occur as shown in the aforementioned FIG. 16(*b*).

The reference potential (Vref) is generated by a reference potential generation circuit 33. The reference voltage generation circuit 33 is constructed by serially connecting an nMOS SOI transistor (M61) having a connected gate, drain, and body with a resistor (R1). This series combination is connected further to the point between the power source Vdd and the ground potential GND. The bias between Vdd and Vref is therefore substantially the soft breakdown voltage of the body bias-controlled SOI device. Above that the leakage current of the BCSOI device increases exponentially. The larger the current leakage at transistor M61, due to many factors in processing, the larger is the Vref voltage. The smaller the current leakage, the smaller is the Vref potential. By using the Vref potential as the reference potential, deviations in the magnitude of leakage current caused by different process conditions can be compensated for by the corresponding change in the magnitude of bias current supplied to the main circuit 31.

On the other hand, in order to generate Vref constantly, a certain magnitude of current must be supplied to the reference potential generating circuit 33. That is, a certain magnitude of leakage current must be present at M61. If the resulting Vref potential and BGND potential are directly compared to each other and the resulting potential is generated at BGND, the magnitude of leakage current leaked at the main circuit 31 will be several times larger than the magnitude of leakage current generated by the transistor M61. This is too large. To avoid this inconvenience, instead of comparing the Vref potential with the BGND potential directly, the BGND value is split by resistors R2 and R3 such that the BGND potential can be appropriately higher when compared to the Vref potential.

For example, R2 and R3 may be adjusted such that 0.5V potential is applied to the point between Vdd and GND.

The differential operational amplifier 32 is the current mirror type shown in FIG. 9. In FIG. 9(*a*), a pMOSFET receives an input signal. In FIG. 9(*a*), the body and source of each of the MOSFETs are interconnected. FIG. 9(*b*) shows the type in which the input signal is applied to the nMOSFET. Also, in FIG. 9(*b*) the body and source of each of the MOSFETs are interconnected. FIG. 9(*c*) is an improved version of FIG. 9(*b*) in which the body and gate of each of the MOSFETs are interconnected. In FIG. 9(*c*), the input signal is applied to the MOSFET. FIG. 9(*d*) is an improved version of FIG. 9(*c*) in which the gate and body of the pMOSFETs are not connected.

The BGND potential of the differential operational amplifier 32 is small and close to the GND potential. Therefore, the differential operational amplifier 32 is designed to operate with a small input potential. To easily obtain a high-speed operation capability with such a small input potential, the differential operational amplifier 32 in which the input signal is applied to its pMOSFET as shown in FIG. 9(*a*) may be preferable. The important point is that the source voltage for the differential operational amplifier 32 is not Vdd but is Vdh which is a boosted potential generated at the booster circuit 34 to be described herein. This provides additional reliability to the operation of the differential operational amplifier 32.

Also, this second embodiment prevents erroneous behavior of transistors which constitute the differential operational amplifier 32 by interconnecting their body and source. This reduces the impact from the "floating body" (floating substrate) effect which fluctuates the body potential of an SOI device. Different transistors or operational conditions create different body potentials and thus provide different threshold values accordingly.

The booster circuit 34 shown in FIG. 8 comprises nMOSFETs (M13, M14) and a capacitor C1. A booster potential Vdh is obtained at the power source potential Vdd by the charge-pump operation. The boosted potential Vdh is monitored at a monitor circuit (MNT) 35 to maintain a preferable potential level.

In this embodiment, the power supply voltage Vdd is, for example, 0.7 V; the booster potential Vdh is, for example, 1 V. The booster potential Vdh is supplied to these circuits which require analog operation such as a part of the voltage-controlled oscillator circuit (VCO) 36 of a phase-locked loop (PLL) circuit besides the differential operational amplifier 32.

Figure 10A:
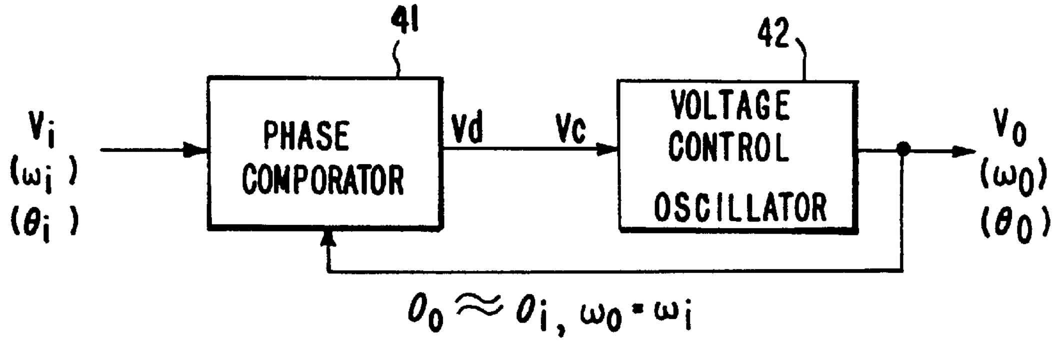
FIG. 10, including FIGS. 10(*a*) and 10(*b*), is a schematic diagram showing a typical PLL circuit and a phase comparator used in the circuit.
Figure 10B:
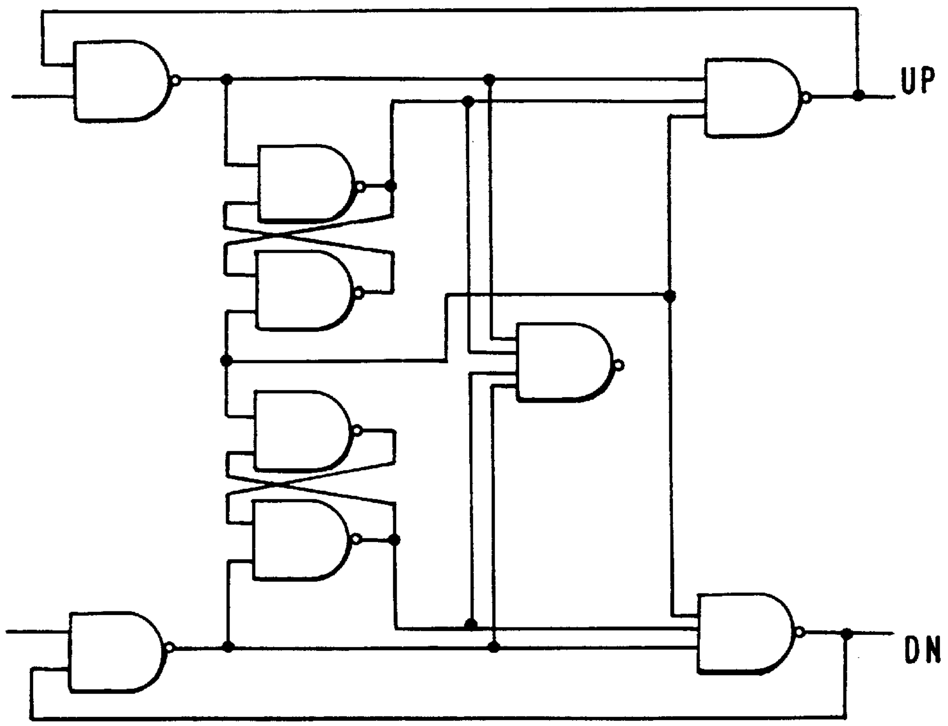
Figure 11A:
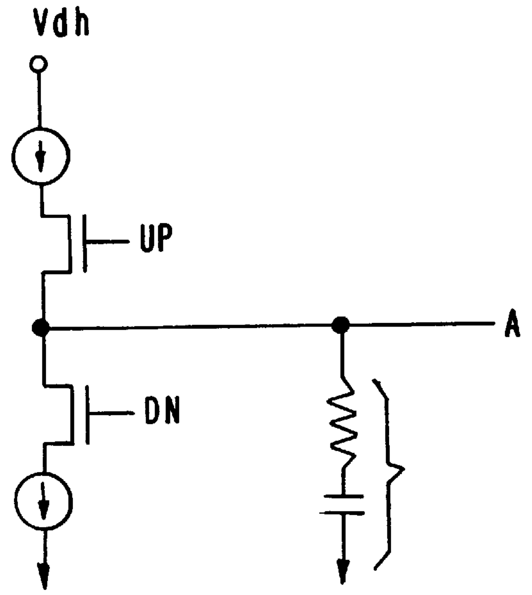
FIG. 11, including FIGS. 11(*a*) and 11(*b*), is a schematic diagram showing a specific configuration of the VCO portion of the PLL circuit of FIG. 10.
Figure 11B:
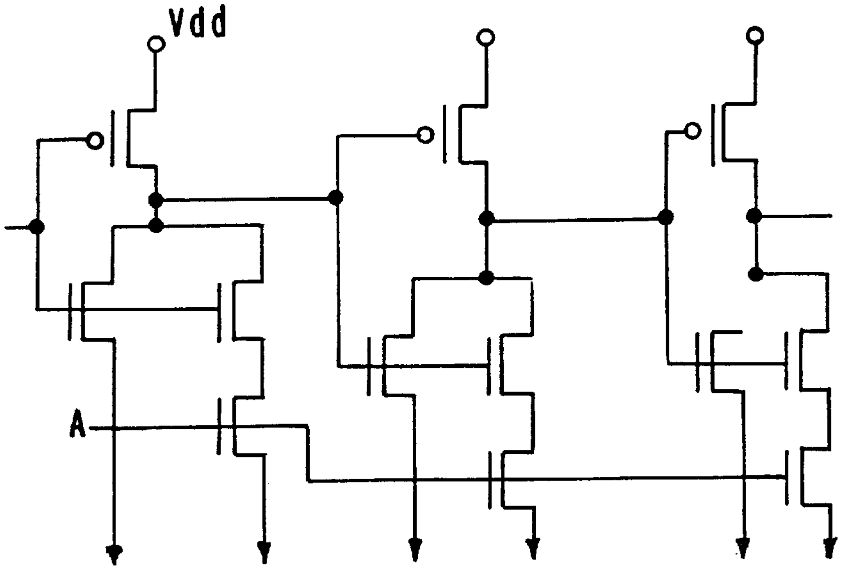

An example of the voltage-controlled oscillator circuits used in this second embodiment is shown in FIGS. 10 and 11. As shown in FIG. 10(*a*), the voltage-controlled oscillator circuit 36 is a conventional PLL circuit comprising a phase comparator 41 and a voltage-controlled oscillator 42. The phase comparator 41 is configured as shown in FIG. 10(*b*). The booster potential Vdh is supplied to the variable delay potential generator circuit of the voltage-controlled oscillator 42 as shown in FIG. 11(*a*). The potential Vdd is supplied to columns of variable delay inverters of the voltage-controlled oscillator 42 as shown in FIG. 11(*b*).

As described, when operation of the MOSFET in the saturation region is required for analog circuits, it is important that the booster voltage Vdh is supplied to provide the required operational margin.

The nMOS driver (M62) of FIG. 8, which drives the aforementioned BGND, is described herein. The source and body of M62 are interconnected in this embodiment to suppress the floating body effect. The gate and body may be interconnected. In order to reduce the leakage current in an IC chip during the sleep mode, a different dopant concentration, which controls the threshold value for a transistor may be used to increase the threshold voltage even though it is higher than necessary for other devices in the circuit. The use of a somewhat higher threshold value does not affect the voltage level required for driving the differential operational amplifier 32 because the booster voltage Vdh is used for the source power.

Also, in the technique used in this second embodiment, the ground potential is increased using an nMOS driving circuit. It is also possible that the potential at the source power be lowered by using a pMOS driving circuit.

Figure 12:
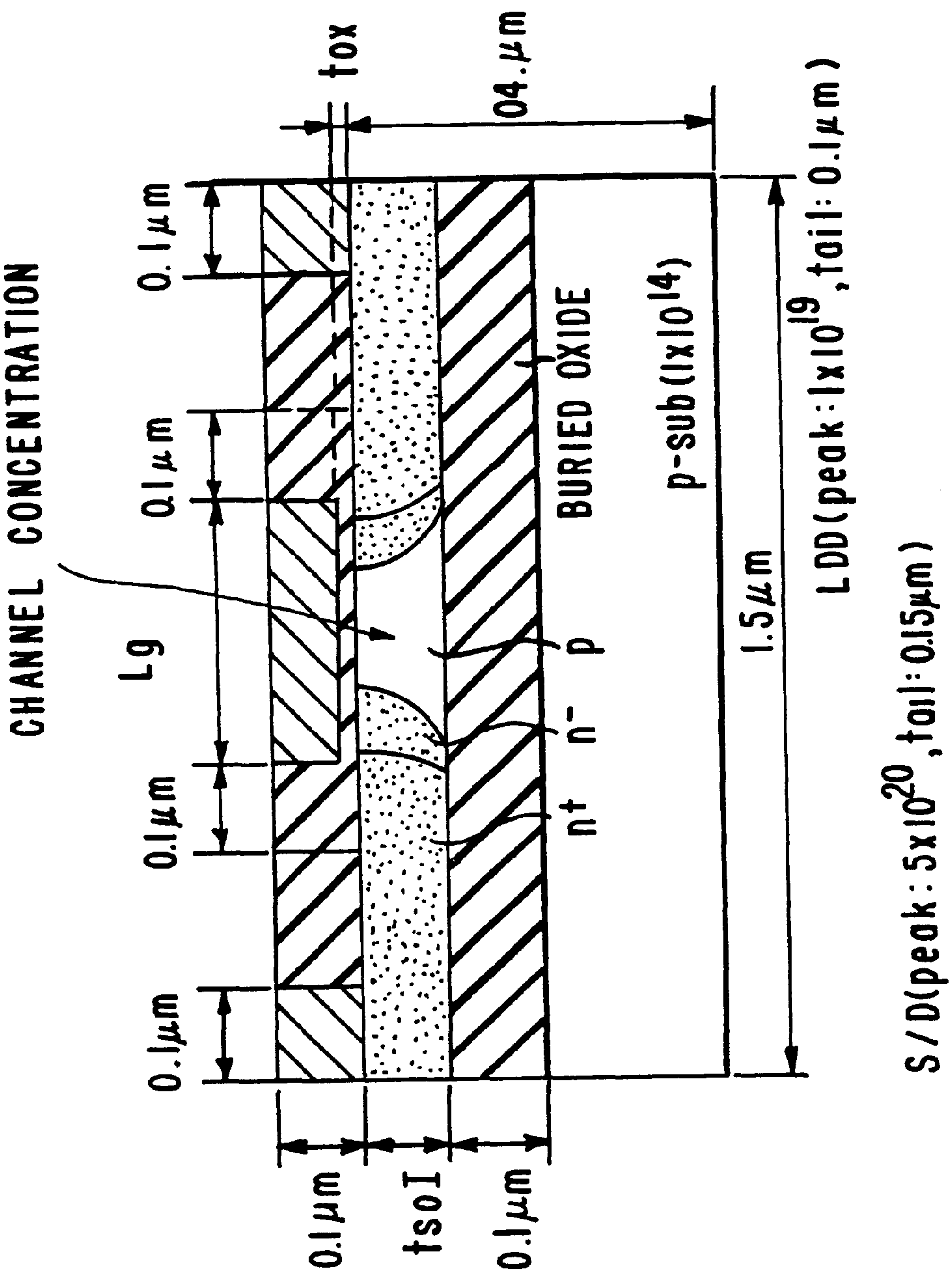
FIG. 12 is a cross-sectional diagram showing the configuration of the device used in the simulation.

Why the ground potential is increased using an nMOS driving circuit is described herein. FIG. 12 shows a device structure used in the simulation described below. The following process parameters are used:

gate: polysilicon ($n^+$, $p^+$)

channel dopant concentration: $1\times10^{15}$ to $10^{18}$ $cm^{-3}$

SOI silicon film thickness: tSOI=100 nm gate length: Lg=0.5 $\mu$m

Silicon dioxide gate thickness: tox=6 nm

Figure 13A:
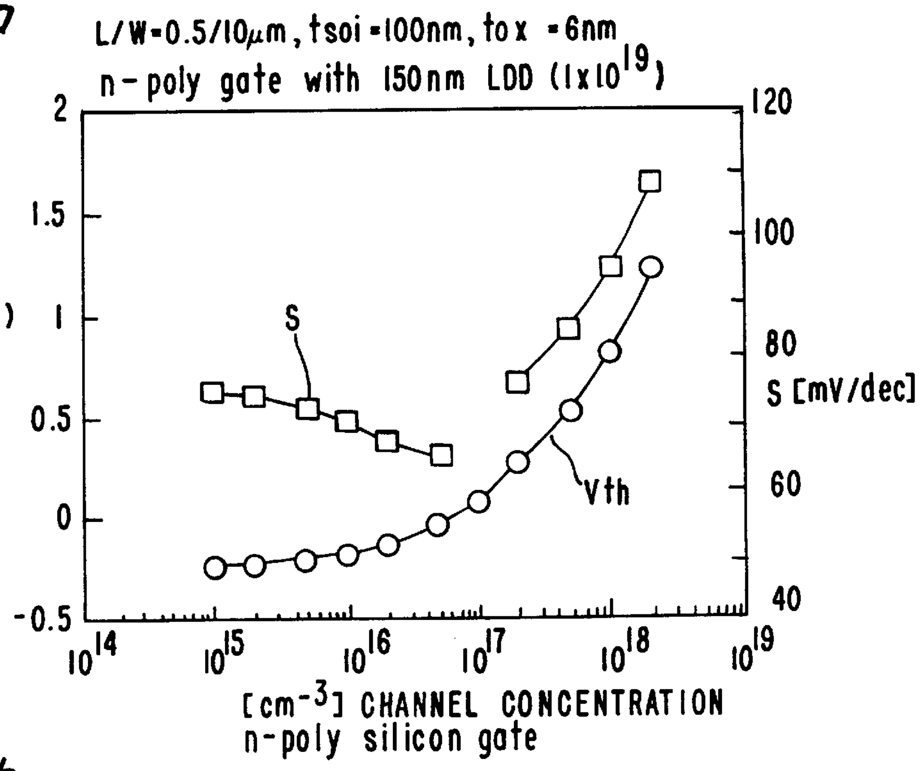
FIG. 13, including FIGS. 13(*a*) and 13(*b*), shows diagrams illustrating the relationship among the dopant concentration, threshold value, and the S parameter.
Figure 13B:
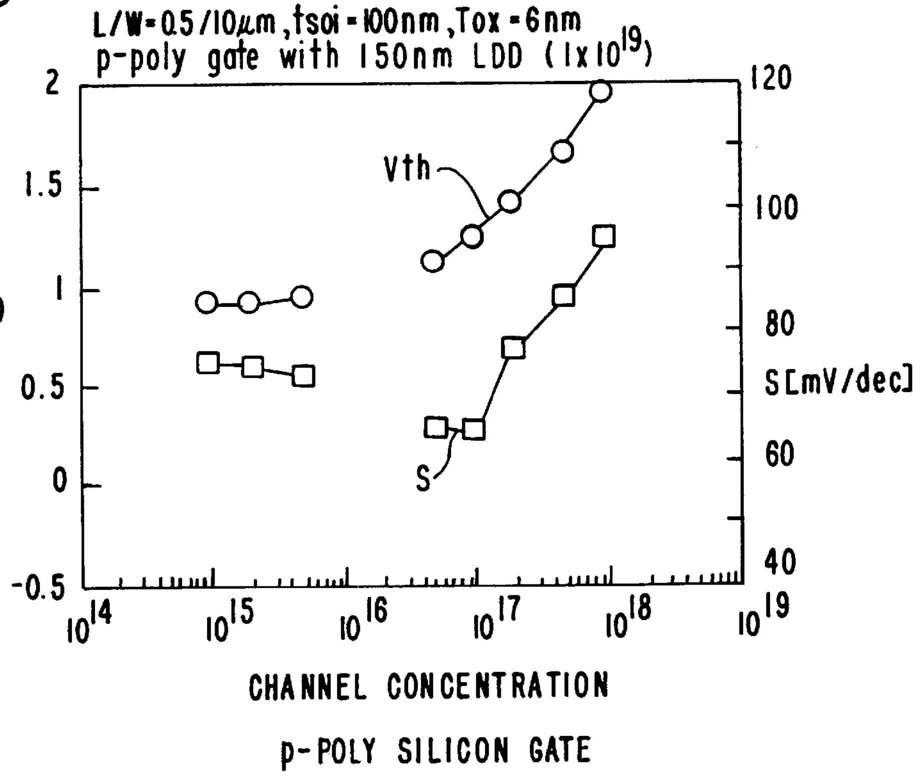

FIG. 13 shows the profile of the channel concentration, threshold value (Vth), and S factor (the magnitude required for the subthreshold swing gate voltage to increase/decrease subthreshold amperes by one digit) in accordance with the above process conditions. FIG. 13(*a*) uses the n-type polysilicon for the gate material. FIG. 13(*b*) uses the p-type polysilicon for the gate material.

In FIG. 13, at the point where the S factor increases sharply, that is, at the p-type dopant concentration, as shown in FIG. 13(*b*), of about $5\times10^{16}$ to about $1\times10^{17}$ or higher, the operating mode becomes the partially depleted type. At the concentration lower than the above, the operating mode becomes the fully depleted type. For example, if the polysilicon gate is n-type, as shown in FIG. 13(*a*), the operating mode becomes the fully depleted type at a favorably low threshold value at the dopant concentration of $2\times10^{17}$. On the other hand, if the polysilicon gate is p-type, the threshold voltage, Vth, reaches 1 V or more. This is unfavorable for driving the circuit at a low voltage. If the gate is n-type, an nMOSFET of the partially depleted type can be obtained easily. If the gate is p-type, a pMOSFET, which is the opposite conductance type, of the partially depleted type can be obtained.

That is, if the gate is n-type for an nMOSFET or the gate is p-type for a pMOSFET, LSI of excellent performance can be obtained. However, if the reduction in manufacturing cost takes priority before selection of the types, the one type, n-type or p-type gate material only may be used. This embodiment shows an example in which an n-type gate is used for a partially depleted nMOSFET to drive BGND. A p-type gate can increase the high-speed performance. An n-type gate can reduce the manufacturing cost.

Figure 14:
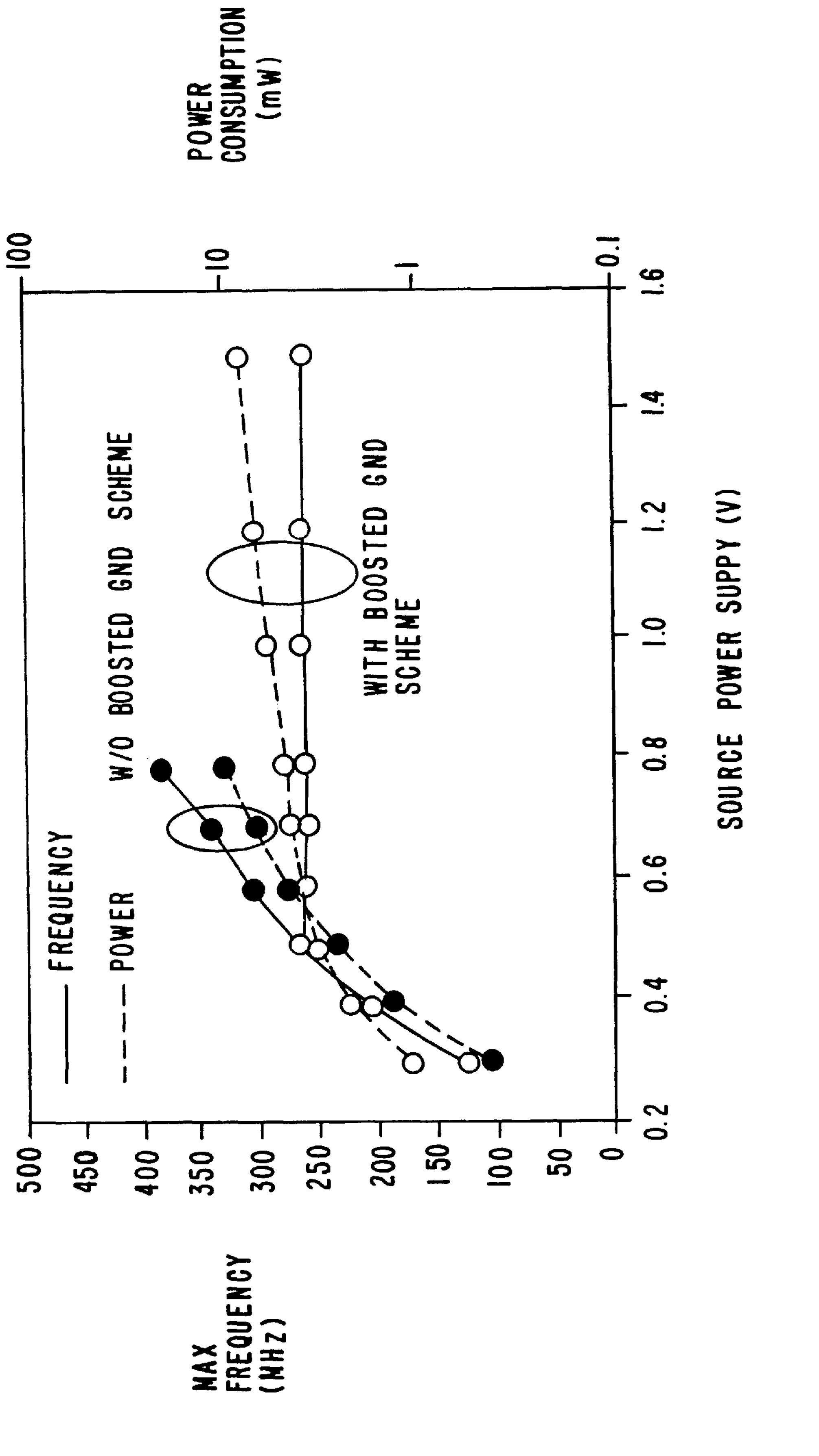
FIG. 14 is a diagram comparing the performance of an LSI incorporating the principles of the present invention with that of conventional technology.

FIG. 14 is a diagram comparing an example of an LSI with the circuit configuration of this embodiment with conventional technology. FIG. 14 demonstrates the interdependent nature of the speed of a 32-bit arithmetic logic unit (ALU) circuit versus voltage. It is apparent from FIG. 14 that the circuit is fast at 0.5V. In accordance with the principles of the present invention, the maximum operating voltage is increased to 1.5V or larger from about 0.8V with the boosted GND scheme.

According to this embodiment shown in FIG. 8, the low voltage and low power consumption switching operation is accomplished using the body-controlled SOI pass gate circuit in the main circuit 31. At the same time, the voltage applied to the main circuit 31 can be limited using the reference voltage generation circuit 33, the differential operational amplifier 32, and the drive MOSFET (M62). Thus an unfavorable increase in leakage current can be prevented because the forward biased body-source interconnects in the main circuit 31 which is suited to a low voltage driver. In addition, even if the source voltage Vdd is made small according to the low-voltage driven main circuit the voltage required for driving the differential operational amplifier 32 or the voltage-controlled oscillator circuit 36 can be applied as the boosted voltage Vdh obtained at the booster circuit 34. This increases the reliability of the circuit's switching operation.

As described, the present invention can provide stable high-speed operation with a wide range of low voltages and having low power consumption.

Various modifications will become possible for those skilled in the art after receiving the teachings of the present disclosure without departing from the scope thereof.

What is claimed is:

1. A semiconductor circuit having a NMOS pass gate network and a buffer circuit coupled to said NMOS pass gate network, said input of said buffer being coupled to an output of said pass gate network said NMOS pass gate network having a NMOSFET wherein an input signal for said NMOSFET is applied to the gate and body of said NMOSFET; and a voltage regulation means to regulate the voltage applied to said semiconductor circuit wherein said regulated voltage is lower than 0.8 V.

2. A semiconductor integrated circuit, as claimed in claim 1, wherein said NMOSFET is formed on a silicon layer formed on an insulated layer (SOI).

3. A semiconductor integrated circuit, as claimed in claim 1, wherein a PMOS flip flop circuit is connected to input of said buffer circuit.

4. A semiconductor integrated circuit as claimed in claim 2 wherein a PMOS flip flop circuit is connected to input said buffer circuit.

5. A semiconductor integrated circuit having a main circuit comprising a NMOS pass gate network and a buffer circuit coupled to said NMOS pass gate network, said NMPOS pass gate network having a NMOSFET wherein an input signal for said NMOSFET is applied to the gate and body of said NMOSFET; and a charge pump circuit coupled to said main circuit to generate a high voltage, wherein said charge pump is composed of capacitor and NMOSFET's gate electrode and body of at least one of said NMOSFETs are directly connected.

6. A semiconductor integrated circuit, as claimed in claim 5, wherein body electrode of each of said NMOSFETs is electrically separated individually.

7. A semiconductor integrated circuit, as claimed in claim 5, wherein said MOSFET is formed on a silicon layer formed on an insulated layer (SOI).

8. A semiconductor integrated circuit, as claimed in claim 5, including a voltage regulation means to regulate the voltage applied to NMOS pass gate network wherein said regulated voltage is lower than 0.8V.

9. A semiconductor integrated circuit as claimed in claim 6 including a voltage regulation means to regulate the voltage applied to NMOS pass gate network wherein said regulated voltage is lower than 0.8V.

10. A semiconductor integrated circuit as claimed in claim 7 including a voltage regulation means to regulate the voltage applied to NMOS pass gate network wherein said regulated voltage is lower than 0.8V.

* * * * *